(12) United States Patent
Cheon

(10) Patent No.: US 7,295,436 B2
(45) Date of Patent: Nov. 13, 2007

(54) COOLING SYSTEM FOR COMPUTER COMPONENTS

(76) Inventor: Kioan Cheon, 2840 West Valley Highway North, Auburn, WA (US) 98001

( * ) Notice: Subject to any disclaimer, the term of this patent is extended or adjusted under 35 U.S.C. 154(b) by 0 days.

(21) Appl. No.: 11/298,217

(22) Filed: Dec. 10, 2005

(65) Prior Publication Data

US 2007/0133172 A1  Jun. 14, 2007

(51) Int. Cl.
*H05K 7/20* (2006.01)

(52) U.S. Cl. .................. 361/699; 361/695; 361/696; 361/697; 361/698; 165/80.3; 165/80.4; 165/104.33; 165/168; 174/16.1; 174/16.3; 174/15.1; 174/15.2; 257/706; 257/708; 257/714; 257/E23.098

(58) Field of Classification Search .......... 361/687, 361/690, 695, 696, 697, 698, 699; 439/31; 174/16.1, 16.3, 15.1, 15.2; 165/104.33, 80.4, 165/80.3, 168, 803; 312/223.2; 257/706, 257/708, 714, E23.098

See application file for complete search history.

(56) References Cited

U.S. PATENT DOCUMENTS

| | | | | |
|---|---|---|---|---|
| 5,243,493 A | * | 9/1993 | Jeng et al. ............... | 361/690 |
| 5,424,915 A | * | 6/1995 | Katooka et al. ........... | 361/695 |
| 5,559,673 A | * | 9/1996 | Gagnon et al. ............ | 361/695 |
| 5,731,954 A | * | 3/1998 | Cheon ....................... | 361/699 |
| 6,105,662 A | * | 8/2000 | Suzuki .................. | 165/104.33 |
| 6,234,240 B1 | * | 5/2001 | Cheon ....................... | 165/80.3 |
| 6,313,990 B1 | * | 11/2001 | Cheon ....................... | 361/699 |
| 6,747,869 B2 | * | 6/2004 | Dong ......................... | 361/687 |
| 6,865,078 B1 | * | 3/2005 | Chang ....................... | 361/695 |
| 6,992,382 B2 | * | 1/2006 | Chrysler et al. ........... | 257/717 |
| 7,113,404 B2 | * | 9/2006 | Naganawa et al. ........ | 361/699 |
| 2004/0042171 A1 | * | 3/2004 | Takamatsu et al. ....... | 361/687 |
| 2005/0180106 A1 | * | 8/2005 | Ohashi et al. ............. | 361/699 |

* cited by examiner

*Primary Examiner*—Boris Chervinsky
*Assistant Examiner*—Courtney Smith
(74) *Attorney, Agent, or Firm*—Delbert J. Barnard

(57) ABSTRACT

A power supply housing (12) is mounted inside of a computer housing (10). Housing (12). It includes components (34) that generate heat when the computer is being used. The power supply housing (12) is sealed in order to make it leak proof. A radiator is positioned outside of the power supply housing (12). It includes a coil assembly having an inlet and an outlet. The inlet is connected to an outlet leading out from the power supply housing (12). The outlet is connected to the inlet of the power supply housing (12). During use of the computer, a cooling fluid is circulated through the coil assembly of the radiator and the power supply housing (12). A fan is positioned outwardly of the radiator and is used to cool the cooling fluid when it is in the coil assembly of the radiator.

16 Claims, 9 Drawing Sheets

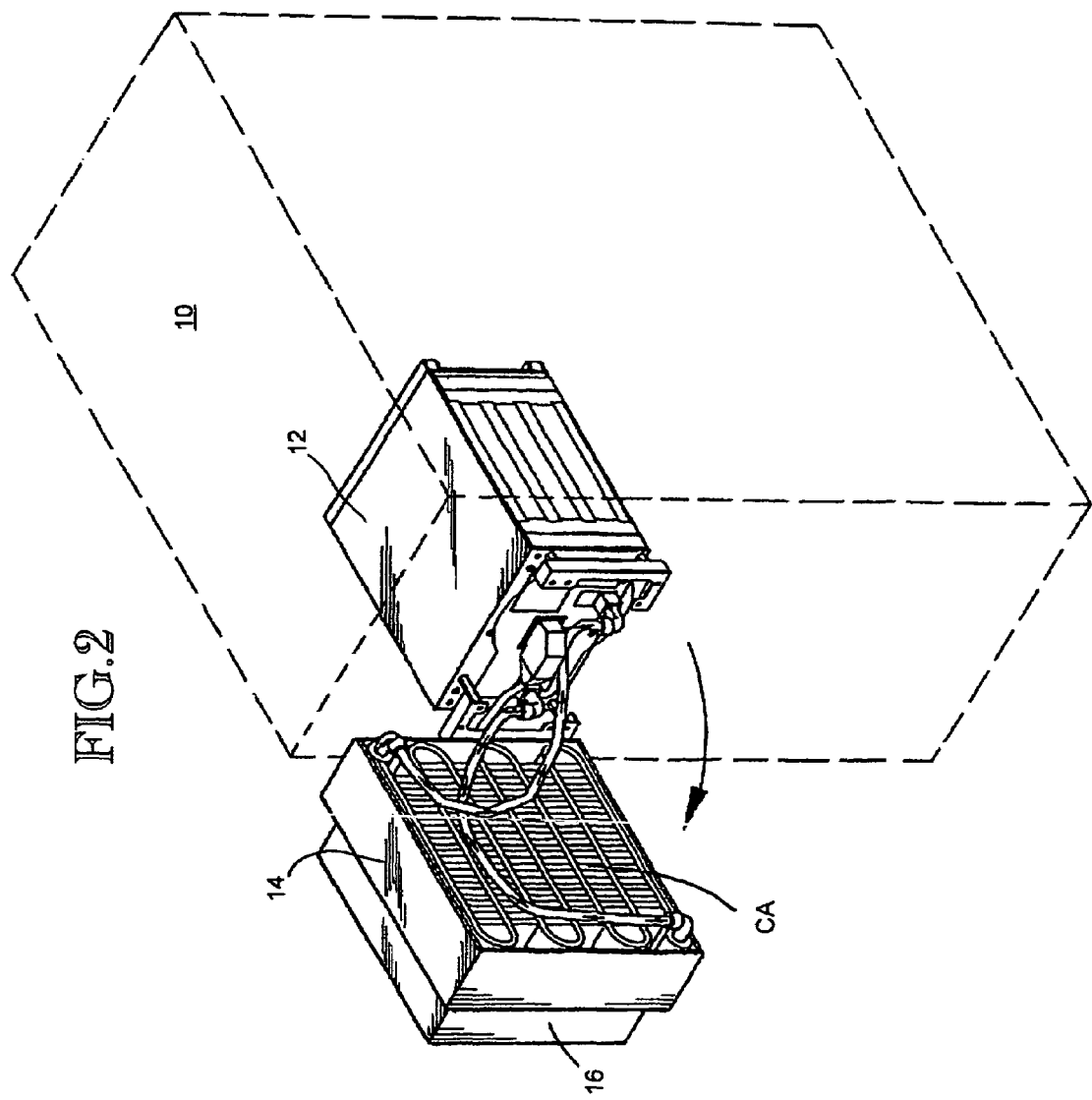

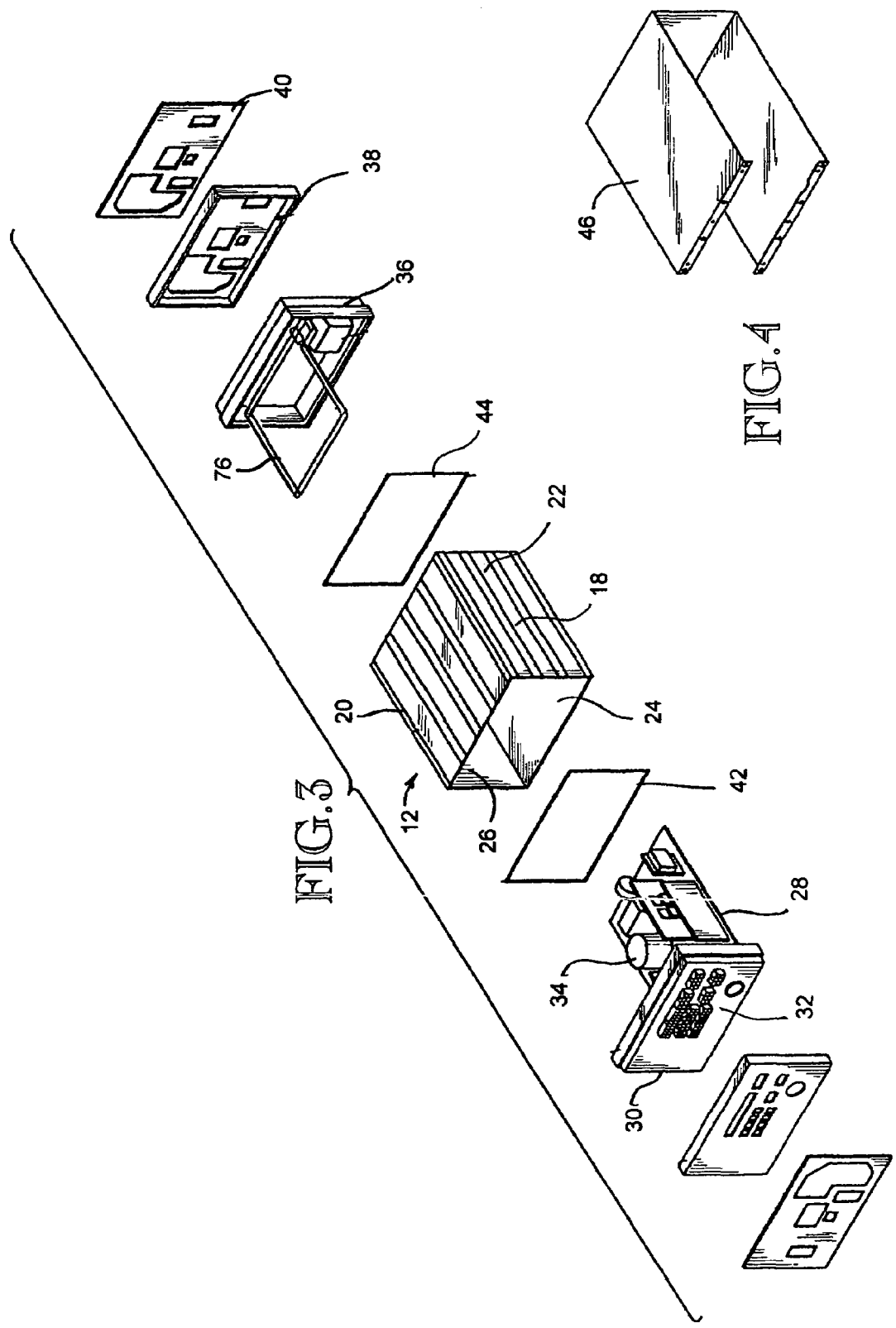

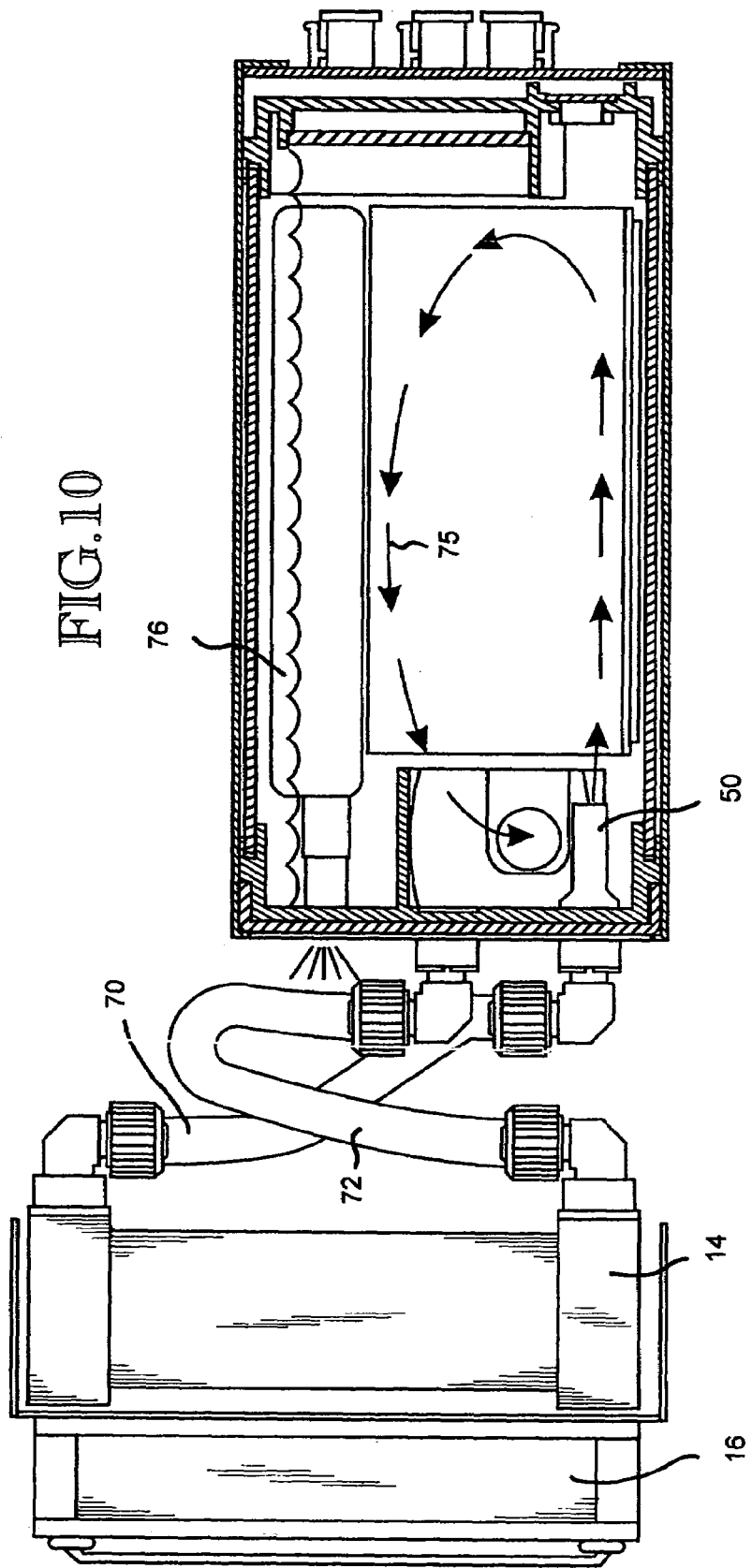

COOLING SYSTEM FOR COMPUTER COMPONENTS

TECHNICAL FIELD

The invention relates to cooling systems for cooling computer components. More particularly, it relates to a cooling system for power supply components, comprising a body of a non-conductive cooling fluid within a power supply housing and a radiator coupled to the power supply housing for obtaining the cooling fluid from the power supply housing, cooling it, and then returning it to the power supply housing.

BACKGROUND OF THE INVENTION

It is well known that computers include components that produce heat. Various types of cooling systems have been proposed for removing heat from the computer components to maintain the computer within acceptable operating temperature limits. The known systems include the systems disclosed by my U.S. Pat. No. 5,731,954, granted Mar. 24, 1998, and entitled Cooling System For Computer, my U.S. Pat. No. 6,234,240, granted May 22, 2001, and entitled Fanless Cooling System For Computer, my U.S. Pat. No. 6,313,990, granted Nov. 6, 2001, and entitled Cooling Apparatus For Electronic Devices, and my U.S. Pat. No. 6,664,627, granted Dec. 19, 2003, and entitled Water Cooling Type Cooling Block For Semiconductor Chip.

The principal object of the present invention is to provide a cooling system that is especially appropriate for use with small computers, including personal computers, work stations, servers, and small mainframes, and which circulates a cooling fluid between a power supply housing within the computer housing and an air-cooled radiator that is outside of the computer housing.

BRIEF SUMMARY OF THE INVENTION

The cooling system of the present invention is used to cool power supply components that are inside of a power supply housing that is inside of a larger computer housing. The power supply housing includes an interior space, a cooling fluid inlet for said space and a cooling fluid outlet for said space. At least one heat producing electronic component is housed within the interior space. A radiator is positioned outside of the computer housing. The radiator includes a coil assembly having an inlet and an outlet. A first conduit is connected to the coil assembly outlet and to the cooling fluid inlet for the power supply housing. A second conduit connects the cooling fluid outlet for the power supply housing to the coil assembly inlet. A cooling fluid is provided in the power supply housing, in the coil assembly and in the two conduits. A pump circulates the cooling fluid. It pumps it out of the radiator into the first conduit, through said first conduit into and through the power supply housing, and from the power supply housing into the conduit leading into the radiator, and through the radiator and back into the conduit that leads to the power supply housing.

In preferred form, the radiator includes a support housing that is mounted onto the main housing for the computer. Preferably also, the support housing is hinge-connected to the main housing. It is swingable between a closed position in which the radiator is adjacent the first housing and an open position in which it is spaced from the first housing.

The first and second conduits are located between the radiator housing and the first housing. Preferably, they are flexible so that they will move when the radiator housing is swung between its open and closed positions.

The radiator may include a cooling air fan that is connected to the radiator housing and is adapted to move air over the coil assembly of the radiator.

Other objects, advantages and features of the invention will become apparent from the description of the best mode set forth below, from the drawings, from the claims and from the principles that are embodied in the specific structures that are illustrated and described.

BRIEF DESCRIPTION OF THE SEVERAL VIEWS OF THE DRAWINGS

Like reference numerals are used to designate like parts throughout the several views of the drawing.

FIG. 2 is a view like FIG. 1 but showing the radiator and cooling fan housings in an open position;

FIG. 3 is an exploded pictorial view of the components of the power supply housing;

FIG. 4 is a pictorial view of an outer sleeve for the power supply housing;

FIG. 10 is a side elevational view of the assembly shown by FIG. 6, with the computer component housing shown in section.

DETAILED DESCRIPTION OF THE ILLUSTRATED EMBODIMENT

Figure 1:
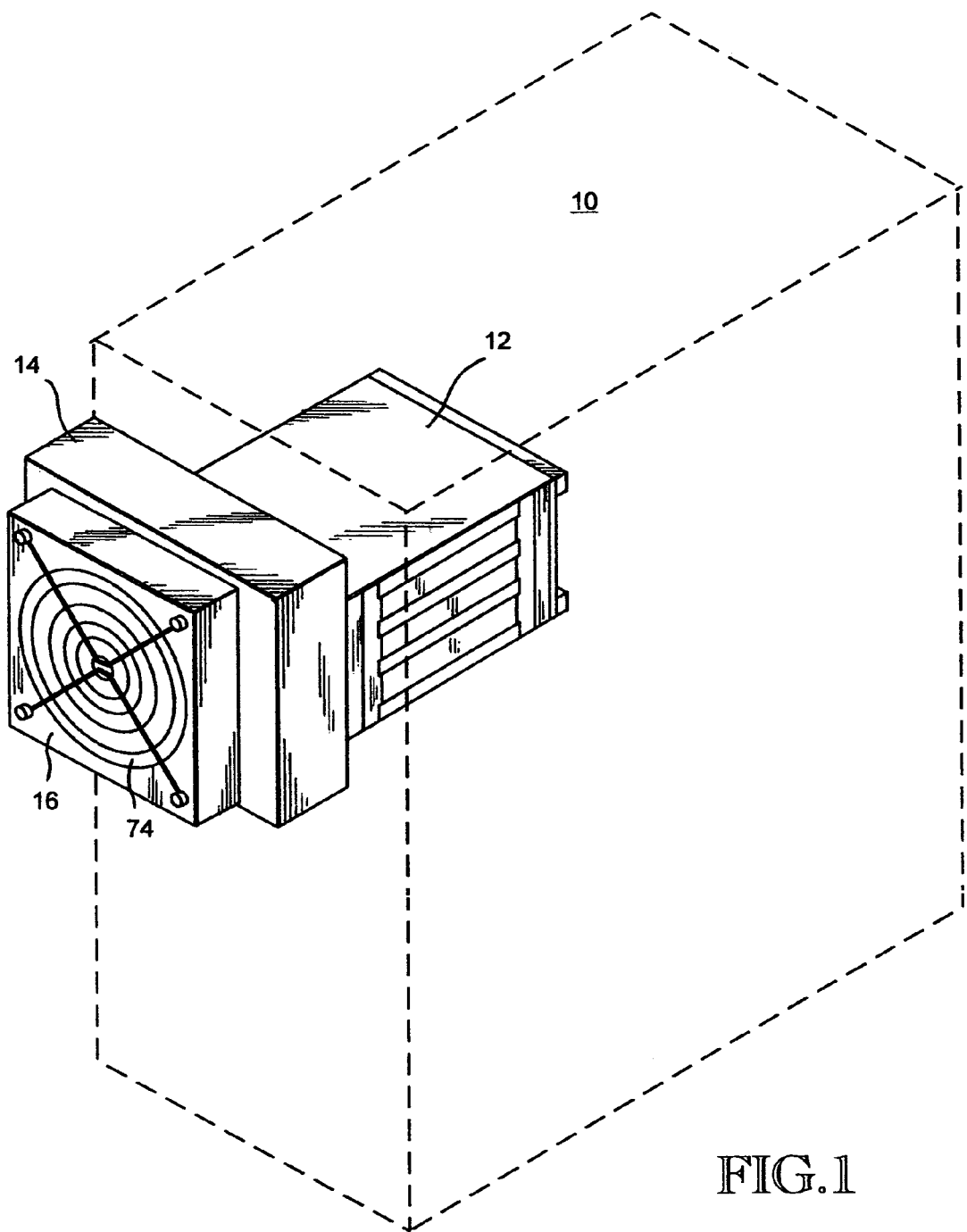
FIG. 1 is a pictorial view showing a first housing for computer components in broken lines and a power supply housing and a cooling fan housing and a radiator housing in solid lines, such view showing the radiator and cooling fan housings in a closed position.
Figure 5:
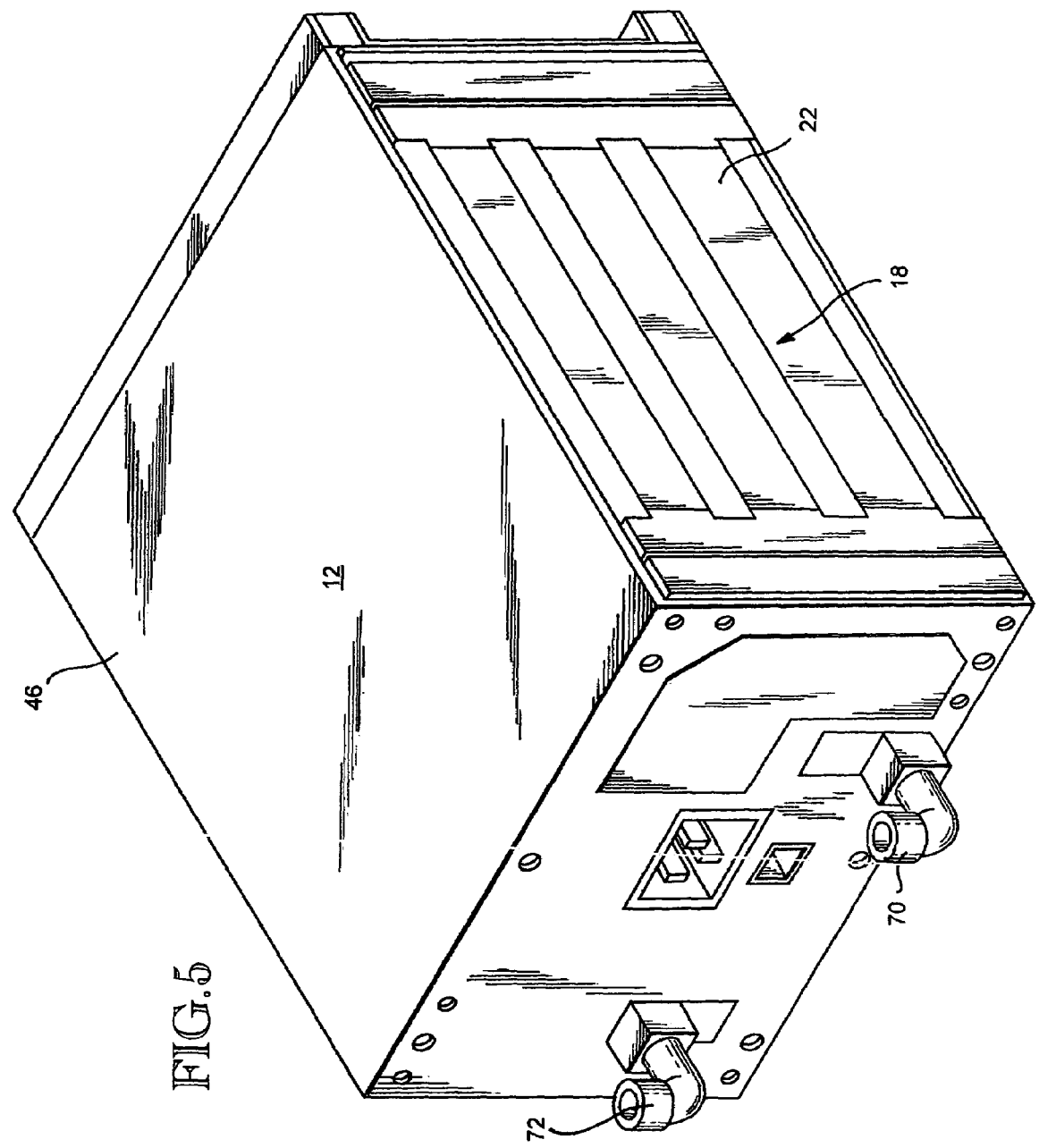
FIG. 5 is a pictorial view of the power supply housing in an assembled condition.

FIG. 1 shows a first or outer housing 10 for computer components. This housing 10 is comparable to the housings shown in FIGS. 1 and FIGS. 1A and 1B of the aforementioned U.S. Pat. Nos. 6,234,240 B1 and 6,313,990 B1. The housing 10 and most of its contents are unimportant to the present invention. FIGS. 1 and 2 show a power supply housing 12 inside of the first housing 10. Housing 10 is comparable to the housing 6 shown in U.S. Pat. No. 6,234,240 B1 and the housing 22 in U.S. Pat. No. 6,313,990 B1. Housing 12 may be mounted inside the housing 10 in any suitable manner. FIGS. 1 and 2 show a radiator housing 14 positioned outside the housing 10 outwardly adjacent the outer end of the housing 12. A cooling fan housing 16 is mounted on the radiator housing 14 in any suitable manner. FIG. 2 shows the radiator housing 14 being mounted for swingable movement relative to the housing 10, between an open position (FIG. 2) and a closed position (FIG. 1). The particular hinge mechanism that is used is not important to the invention and can vary considerably in its make up. The important thing is that the housing 14, with housing 16 attached to it, can be swung between open and closed positions.

Figure 6:
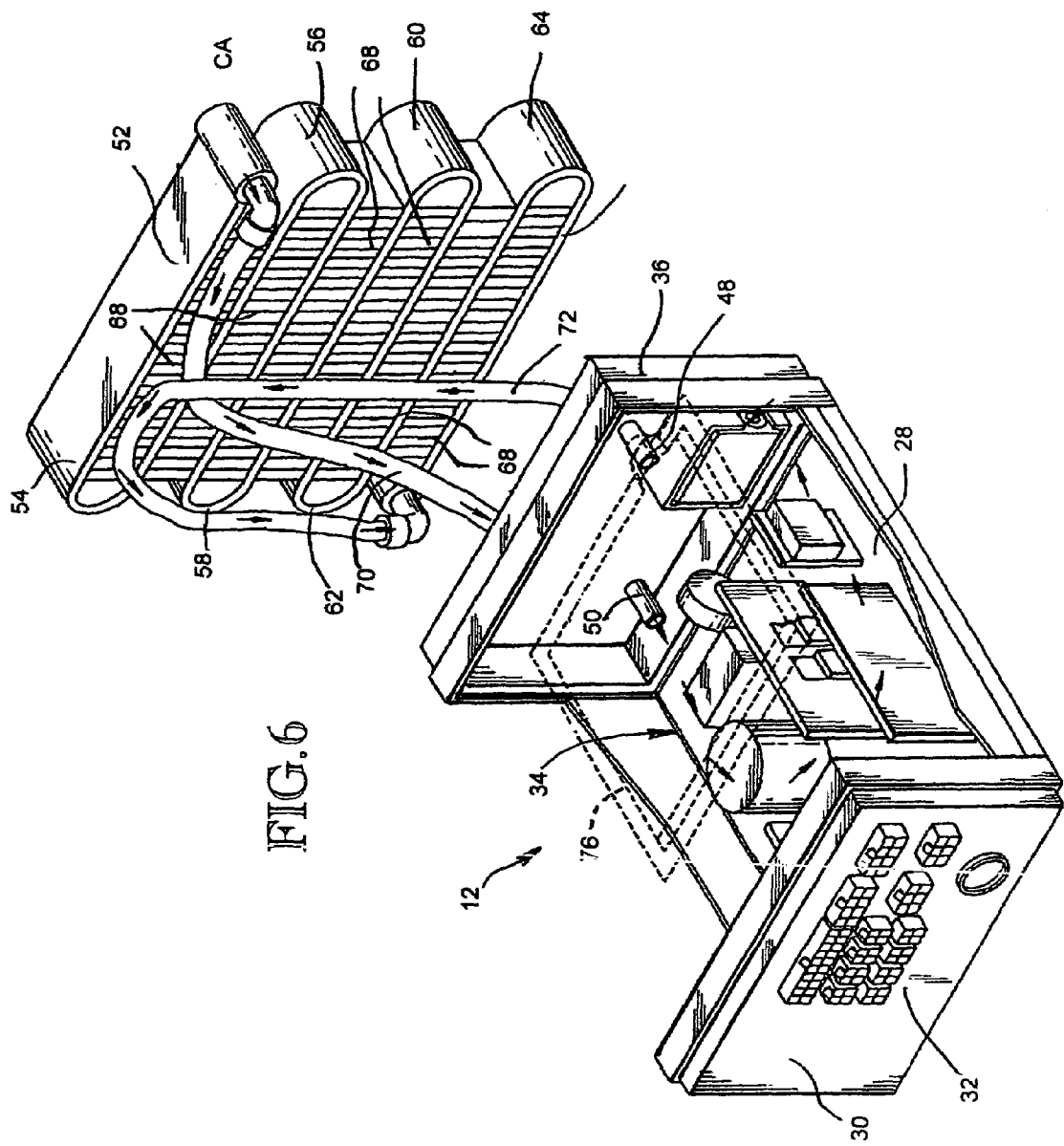
FIG. 6 is a pictorial view of the power supply housing coupled to the radiator, with a foreground wall portion of the radiator omitted.
Figure 7:
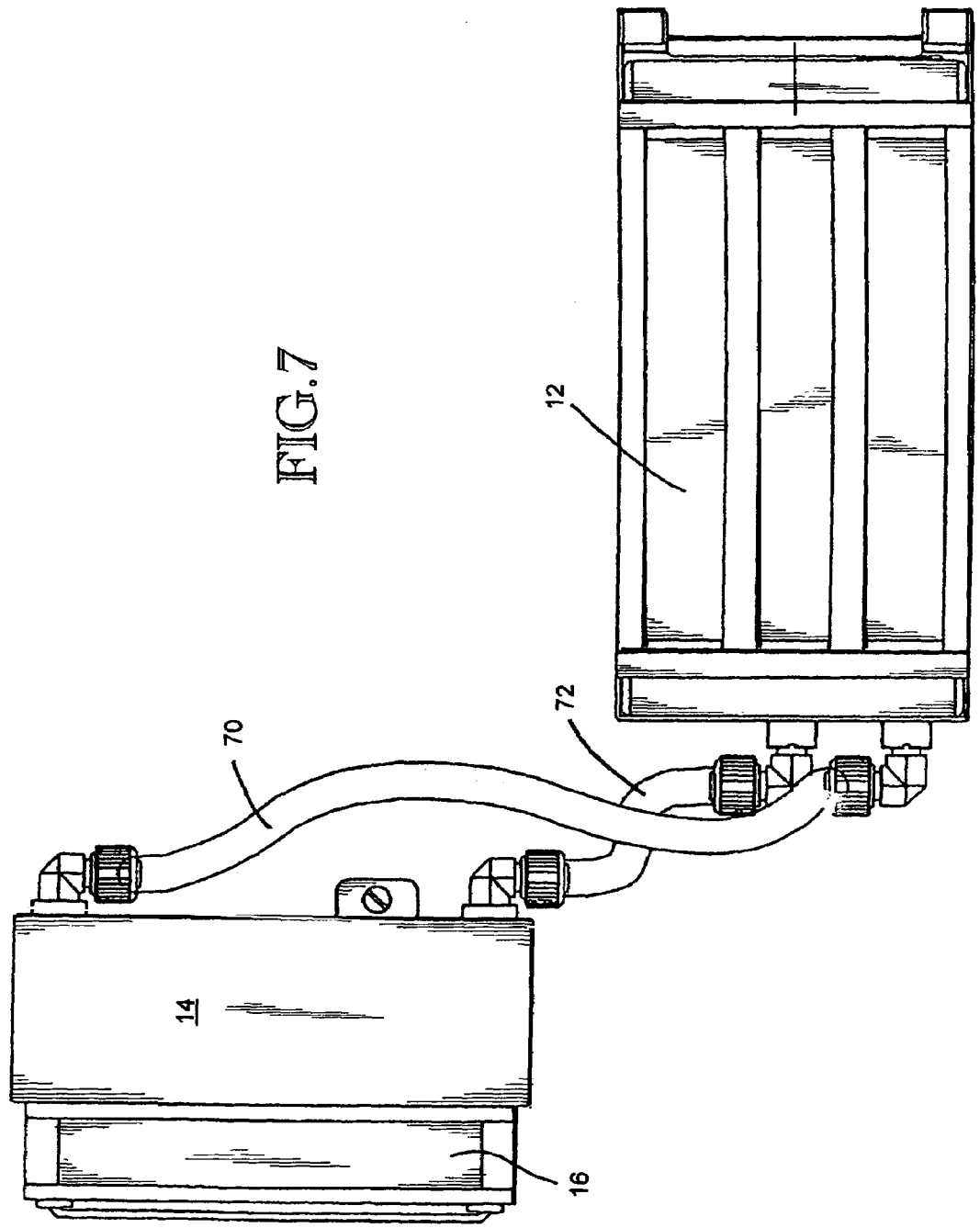
FIG. 7 is a side elevational view of the radiator and cooling fan housings spaced from the power supply housing, such view showing the cooling fluid conduits that extend between the radiator and the power supply housing.
Figure 8:
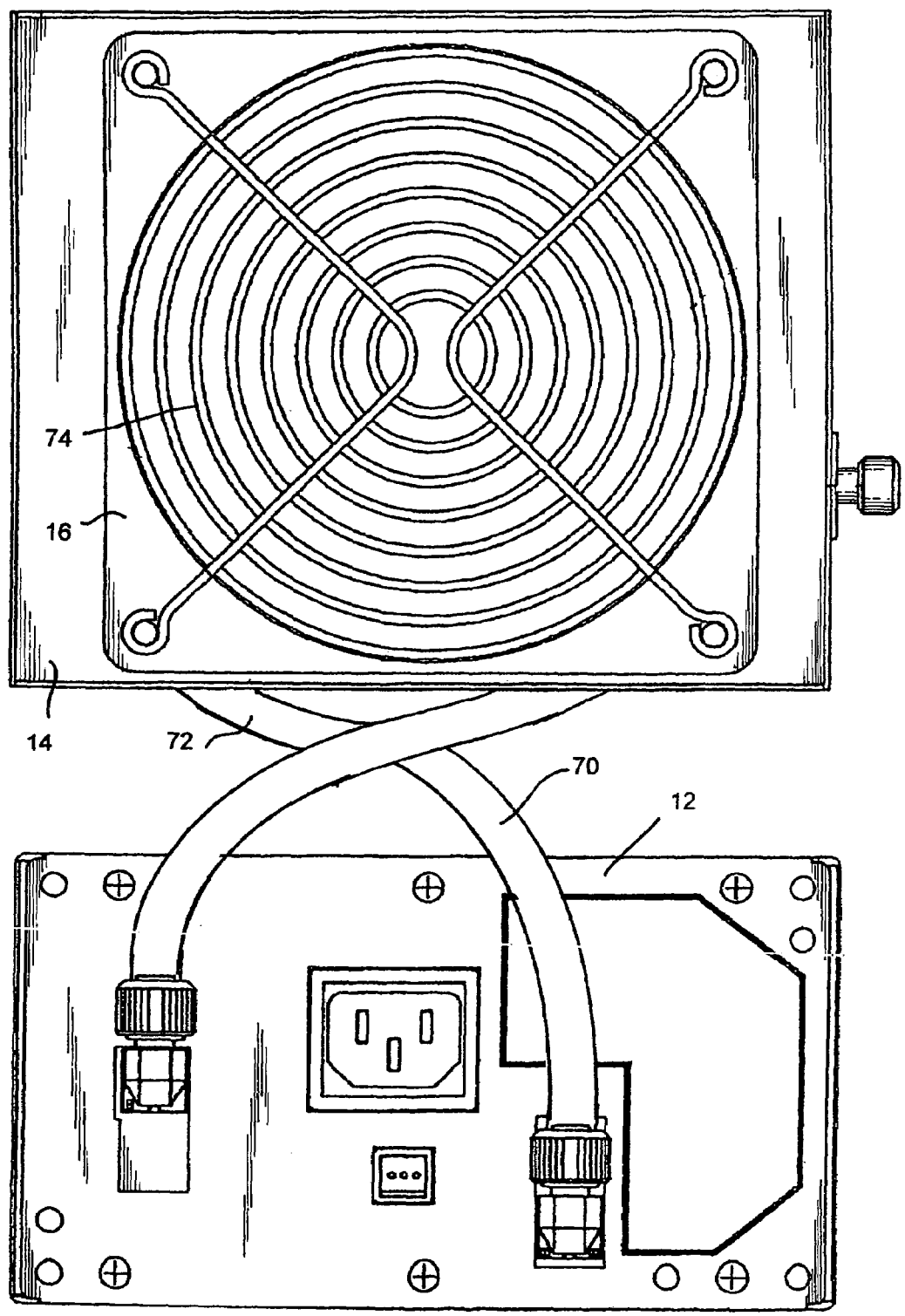
FIG. 8 is an end elevational view looking towards the left end of FIG. 7.
Figure 9:
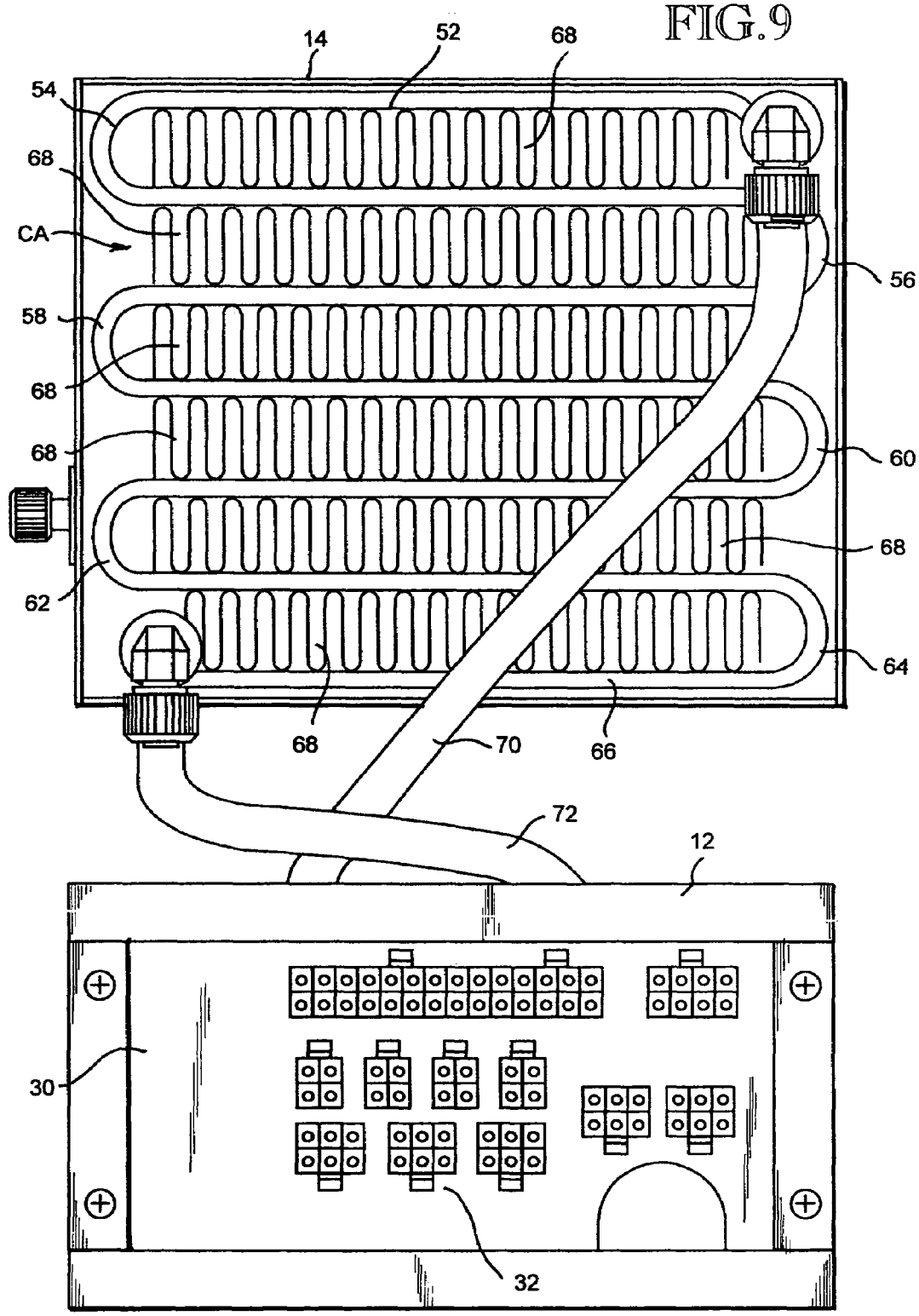
FIG. 9 is an end elevational view of the opposite ends of the radiator and power supply housings.

Referring to FIG. 3, the power supply housing 12 may include a tubular portion 18 that has four sides 20, 22, 24, 26. It also has opposite ends which are open. A power component tray 28 is connected at one end to a wall 30 that carries power supply elements 32. Power supply components 34 are mounted on the tray 28. Some or all of the components 34 include electronic components that generate heat. Wall 30 is positioned at one end of the sleeve 18 and components 36, 38, 40 form a second end wall located outwardly of the opposite end of sleeve 18. A first gasket 42 is positioned between end wall 30 and the adjacent end of sleeve 18. A second gasket 44 is positioned between the second end of sleeve 18 and the end wall component 36. The power supply components are assembled together and then are slid sideways into the sleeve 46. FIG. 6 shows the power supply housing 12 minus the sleeve 18. FIG. 6 shows that end wall 36 includes a cooling fluid outlet 48 and a cooling fluid inlet 50.

The radiator includes a coil 52 having turns 52, 54, 56, 58, 60, 62, 64, 66 separated by radiator fins 68. As is well known in the art, the coils 52, 54, 56, 58, 60, 62, 64, 66 are hollow and a cooling fluid forms through them. A first conduit 70 connects one end of the coil assembly 52, 54, 56, 58, 60, 62, 64, 66 to the cooling fluid inlet 50. A second conduit 72 connects the cooling fluid outlet 48 to the opposite end of the coil assembly.

When the power supply housing 12 is assembled, its interior space is sealed. This space, the conduits 70, 72 and the inside passageways of the radiator are filled with a suitable cooling fluid. This fluid is pumped through the coil assembly of the radiator, then into and through the interior space of the power supply housing 12, and then from the interior space of the power supply housing 12 back into the coil assembly of the radiator.

The fan housing 16 includes a rotary fan (not shown) behind a grill 74. When the fan is turned on, it blows ambient air over the coils 52, 54, 56, 58, 60, 62, 64, 66 and through the radiator fins 68. Heat from the cooling fluid in the coil assembly is transferred to the ambient air and the cooling fluid is cooled down so that it can be pumped back into the power supply housing 12 in a relatively cool condition. This cooling fluid moves through inlet 50 into the interior space of the power supply housing 12 and is circulated over the electronic components in the housing 12 that generate heat when the computer is on. This heat is picked up in the coolant fluid and then is carried out of the power supply housing 12 through the conduit 72 back into the coil assembly where it is cooled another time. The circulation of the cooling fluid occurs throughout the operation of the computer.

By way of example, the cooling fluid may be a liquid fluorocarbon 75, such as Freon in which a part or all hydrogen atoms have been replaced by fluorine atoms. The fluorocarbon 75 is nonflammable and heat-stable. An inflatable member 76 having a flexible sidewall is also positioned within side the interior space. Member 76 is like a balloon. It is inflated by an inert gas. The cooling fluid fills the remaining portion of space. During use of the electronic device, at least some of the electronic components on board 60 generate heat. This heat is transferred to the cooling fluid. In the process, the electronic components are cooled and the cooling fluid 75 and the housing are heated. As the coolant 75 is heated, it expands and compresses the inflatable member 76, causing it to contract. Heat removal from the liquid 76 causes it to contract and this allows the gas in the inflatable member 76 to expand. The inflatable member 76 functions to maintain liquid coolant 75 in contact with the electronic components in the housing 10 that generate heat when the computer is on.

The illustrated embodiments are only examples of the present invention and, therefore, are non-limitive. It is to be understood that many changes in the particular structure, materials and features of the invention may be made without departing from the spirit and scope of the invention. Therefore, it is my intention that my patent rights not be limited by the particular embodiment that is illustrated and described herein, but rather is to be determined by the following patents claims, interpreted according to accepted doctrines of patent claim interpretation, including use of the doctrine of equivalents.

What is claimed is:

1. A cooling system for a power supply in a computer, comprising:
    a first housing for computer components;
    a power supply housing inside the first housing;
    said power supply housing including an interior space, a cooling fluid inlet for said space and a cooling fluid outlet for said space;
    at least one heat producing electronic component within the interior space of the power supply housing;
    a radiator outside of said first housing, said radiator including a coil assembly that includes an inlet and an outlet;
    a first conduit connecting the coil assembly outlet to the cooling fluid inlet for the power supply housing;
    a second conduit leading from the cooling fluid outlet for the power supply housing to the coil assembly inlet;
    a cooling fluid in the power supply housing, in the coil assembly and in the first and second conduits; and
    a pump adapted for pumping cooling fluid out from the power supply housing, into the conduit, into the coil assembly, and into the first conduit and back to the power supply housing,
    wherein the heat producing electronic component is in direct contact with the cooling fluid as the cooling fluid flows through the interior space of the power supply housing from the cooling fluid inlet for the power supply housing to the cooling fluid outlet for the power supply housing.

2. The cooling system of claim 1, comprising a support housing for the radiator that is mounted onto the first housing for computer components.

3. The cooling system of claim 2, wherein the support housing for the radiator is hinge connected to the first housing for the computer components and is swingable between a closed position in which the radiator is adjacent the first housing and an open position in which it is spaced from the first housing for the computer components.

4. The cooling system of claim 3, wherein the first and second conduits are positioned between the radiator housing and the first housing and are flexible so that they will move when the radiator housing is swung between its open and closed positions.

5. The cooling system of claim 2, comprising a cooling air fan connected to the radiator housing outside of said radiator and adapted to move air over the coil assembly of the radiator.

6. The cooling system of claim 1, wherein the cooling fluid is a fluorocarbon.

7. The cooling system of claim 1, wherein the cooling fluid is a liquid fluorocarbon.

8. The cooling system of claim 2, wherein the cooling fluid is a fluorocarbon.

9. The cooling system of claim 2, wherein the cooling fluid is a liquid fluorocarbon.

10. The cooling system of claim 3, wherein the cooling fluid is a fluorocarbon.

11. The cooling system of claim 3, wherein the cooling fluid is a liquid fluorocarbon.

12. The cooling system of claim 4, wherein the cooling fluid is a fluorocarbon.

13. The cooling system of claim 4, wherein the cooling fluid is a liquid fluorocarbon.

14. The cooling system of claim 5, wherein the cooling fluid is a fluorocarbon.

15. The cooling system of claim 5, wherein the cooling fluid is a liquid fluorocarbon.

16. The cooling system of claim 1, further comprising an inflatable member inside the power supply housing, said inflatable member having a flexible sidewall and containing an inflation gas, wherein the inflatable member is contacted by the cooling fluid, wherein heat removed from the electronic component within the interior space of the power supply housing will heat the cooling fluid, causing it to expand and compress the inflatable member, causing it to contract, and wherein heat removal from the cooling fluid by the radiator will cause the cooling fluid to contract and this allows the gas in the inflatable member to expand, whereby said inflatable member functions to maintain cooling fluid in contact with the heat producing electronic component when the computer is on.

* * * * *